(12) United States Patent
Kobayashi et al.

(10) Patent No.: US 9,406,536 B1
(45) Date of Patent: Aug. 2, 2016

(54) METHOD AND SYSTEM FOR MANUFACTURING SEMICONDUCTOR EPITAXY STRUCTURE

(71) Applicant: HERMES-EPITEK CORP., Taipei (TW)

(72) Inventors: Takashi Kobayashi, Hsinchu (TW); Po-Jung Lin, Hsinchu (TW); Che-Lin Chen, Tainan (TW); Bu-Chin Chung, Taipei (TW)

(73) Assignee: HERMES-EPITEK CORP., Taipei (TW)

( * ) Notice: Subject to any disclaimer, the term of this patent is extended or adjusted under 35 U.S.C. 154(b) by 0 days.

(21) Appl. No.: 14/754,207

(22) Filed: Jun. 29, 2015

(51) Int. Cl.
  *H01L 21/00* (2006.01)
  *H01L 21/67* (2006.01)
  *H01L 21/02* (2006.01)
  *H01L 21/66* (2006.01)

(52) U.S. Cl.
  CPC ...... *H01L 21/67288* (2013.01); *H01L 21/0242* (2013.01); *H01L 21/0254* (2013.01); *H01L 21/02381* (2013.01); *H01L 21/02458* (2013.01); *H01L 22/26* (2013.01)

(58) Field of Classification Search
  CPC ......... H01L 22/12; H01L 22/20; H01L 22/26; H01L 21/00; H01L 21/02; H01L 21/20; H01L 21/30; H01L 21/36; H01L 21/324; H01L 21/02502; H01L 21/02381; H01L 21/02458; H01L 21/0262; H01L 21/0254; H01L 21/67253

USPC .................................... 438/7, 483, 718, 796
  See application file for complete search history.

(56) References Cited

U.S. PATENT DOCUMENTS

| | | | |
|---|---|---|---|
| 2005/0164482 A1* | 7/2005 | Saxler | H01L 21/02378 438/604 |
| 2006/0011129 A1* | 1/2006 | Lan | C30B 29/42 117/89 |
| 2013/0032812 A1* | 2/2013 | Kizilyalli | H01L 21/8252 257/76 |
| 2014/0206179 A1* | 7/2014 | Nie | H01L 29/66204 438/478 |

* cited by examiner

*Primary Examiner* — Chuong A Luu
(74) *Attorney, Agent, or Firm* — Muncy, Geissler, Olds & Lowe, P.C.

(57) ABSTRACT

A system for manufacturing semiconductor epitaxy structure includes a deposition apparatus, a curvature monitor system and a control unit. The deposition apparatus is configured for sequentially depositing a buffer layer, a first epitaxy layer, an insertion layer, a second epitaxy layer on a substrate. The curvature monitor system is configured for monitoring a curvature value of the semiconductor epitaxy structure. The control unit is configured for controlling the deposition apparatus to stop depositing the buffer layer, the first epitaxy layer, the insertion layer and the second epitaxy layer according to the curvature value of the semiconductor epitaxy structure measured by the curvature monitor system. The above-mentioned system for manufacturing semiconductor epitaxy structure is able to effectively control the strain of the semiconductor epitaxy structure during growth. A method for manufacturing semiconductor epitaxy structure is also disclosed.

10 Claims, 2 Drawing Sheets

METHOD AND SYSTEM FOR MANUFACTURING SEMICONDUCTOR EPITAXY STRUCTURE

BACKGROUND OF THE INVENTION

1. Field of the Invention

The present invention relates to a method and a system for manufacturing semiconductor epitaxy structure, and more particularly to a method and a system for manufacturing semiconductor epitaxy structure without epitaxy layer cracks.

2. Description of the Prior Art

It is an important technology to grow epitaxy layers on a large size substrate, such as growing a thicker gallium nitride (GaN) epitaxy layer on a silicon (Si) substrate. In this structure, a major problem is surface cracks after cooling down and lead to the device failure. In order to prevent surface cracks, the design of epitaxy structure can be changed to control strain.

During the cooling down process, the tensile stress in the GaN epitaxy layer is generated by the different thermal expansion coefficients of the GaN epitaxy layer and the Si substrate. In order to compensate the tensile stress, GaN epitaxy layer should be in a compressive stress state before cooling down process. Then, the crack-free GaN epitaxy layer on Si substrate will be obtained. The compressive stress of GaN epitaxy layer is usually on aluminum nitride (AlN) layers, so that AlN is usually used as buffer layer between GaN epitaxy layer and Si substrate. In the structure of GaN layer and AlN layer on Si substrate, it is difficult to get 1 µm GaN epitaxy layer without cracks on 6 inch Si substrate. But for high power device applications, thicker GaN epitaxy layer is required.

The concept of strain engineering is used to get thicker GaN epitaxy layer on large size Si substrate. For example, different structures with sequential layers are designed to control the strain which enables the growth of thicker epitaxy structure without cracks. However, it is difficult to control the strain of the structure because of the variation of process conditions, such as temperature, or lattice defects etc. For example, accumulated compressive stress drives the lattice relaxation, which results in the curvature value with tensile tendency during the cooling down process. In other case, excessive compressive stress with plastic deformation cannot be dissipated during the cooling down process so that the structure shows the compressive tendency after the cooling down process.

Accordingly, it is highly desirable to determine deposition time or thickness of the layers on the substrate to control the strain of the structure.

SUMMARY OF THE INVENTION

The present invention is directed to a method and a system for manufacturing a semiconductor epitaxy structure, which utilizes a curvature monitor system to monitor the structure in real time to get a curvature value, and the deposition time or thickness of a buffer layer, an epitaxy layer and an insertion layer can be determined by the curvature value to effectively control the strain of the structure.

In one embodiment, the proposed method for manufacturing semiconductor epitaxy structure includes: providing a substrate which is monitored in real time by a curvature monitor system to get a curvature value; depositing a buffer layer on the substrate, wherein thermal expansion coefficient and lattice constant of the buffer layer and the substrate are different so that the semiconductor epitaxy structure has a first strain to curve toward a first direction and the curvature monitor system monitors the curvature value of the semiconductor epitaxy structure in real time to determine whether stop depositing the buffer layer or not; depositing a first epitaxy layer on the buffer layer, wherein thermal expansion coefficient and lattice constant of the first epitaxy layer and the buffer layer are different so that the semiconductor epitaxy structure has a second strain to curve toward a second direction and the curvature monitor system monitors the curvature value of the semiconductor epitaxy structure in real time to determine whether stop depositing the first epitaxy layer or not; depositing an insertion layer on the first epitaxy layer, wherein thermal expansion coefficient and lattice constant of the insertion layer and the first epitaxy layer are different so that the semiconductor epitaxy structure has a third strain to curve toward the first direction and the curvature monitor system monitors the curvature value of the semiconductor epitaxy structure in real time to determine whether stop depositing the insertion layer or not; and depositing a second epitaxy layer on the insertion layer, wherein thermal expansion coefficient and lattice constant of the second epitaxy layer and the insertion layer are different so that the semiconductor epitaxy structure has a fourth strain to curve toward the second direction and the curvature monitor system monitors the curvature value of the semiconductor epitaxy structure in real time to determine whether stop depositing the second epitaxy layer or not.

A system for manufacturing semiconductor epitaxy structure according to another embodiment of the present invention includes: a deposition apparatus, for sequentially depositing a buffer layer, a first epitaxy layer, an insertion layer, a second epitaxy layer on a substrate; a curvature monitor system, for monitoring a curvature value of the semiconductor epitaxy structure; and a control unit electrically connected with the deposition apparatus and the curvature monitor system, for controlling the deposition apparatus to stop depositing the buffer layer, the first epitaxy layer, the insertion layer and the second epitaxy layer according to the curvature value of the semiconductor epitaxy structure measured by the curvature monitor system.

The objective, technologies, features and advantages of the present invention will become apparent from the following description in conjunction with the accompanying drawings wherein certain embodiments of the present invention are set forth by way of illustration and example.

BRIEF DESCRIPTION OF THE DRAWINGS

The foregoing conceptions and their accompanying advantages of this invention will become more readily appreciated after being better understood by referring to the following detailed description, in conjunction with the accompanying drawings, wherein.

DESCRIPTION OF THE PREFERRED EMBODIMENT

The detailed explanation of the present invention is described as follows. The described preferred embodiments are presented for purposes of illustrations and description, and they are not intended to limit the scope of the present invention.

Figure 1:
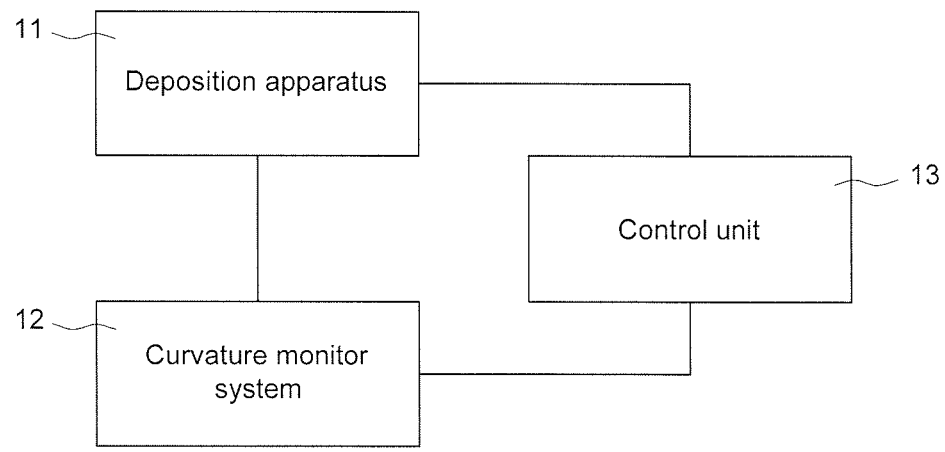
FIG. 1 is a block diagram schematically illustrating a system for manufacturing semiconductor epitaxy structure according to an embodiment of the present invention.
Figure 3:
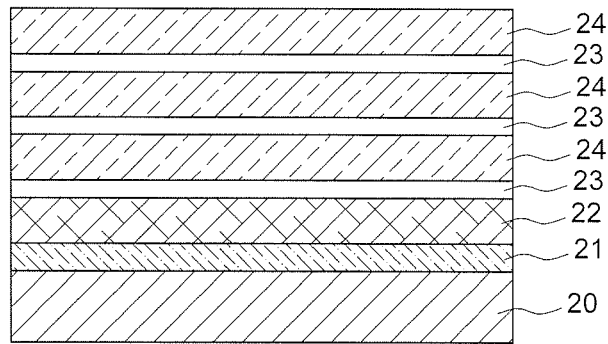
FIG. 3 is a diagram schematically illustrating a semiconductor epitaxy structure according to an embodiment of the present invention.

Referring to FIG. 1, FIG. 1 illustrates a system for manufacturing a semiconductor epitaxy structure according to an embodiment of the present invention. In this embodiment, the system includes a deposition apparatus 11, a curvature monitor system 12, and a control unit 13. The deposition apparatus 11 is utilized to sequentially deposit a buffer layer 21, a first epitaxy layer 22, an insertion layer 23, and a second epitaxy layer 24 on a substrate 20, as shown in FIG. 3. In one embodiment, the first epitaxy layer 22 and the second epitaxy layer 24 may be the same material, such as gallium nitride (GaN). Besides, the insertion layer 23 and the second epitaxy layer 24 are deposited in an interlacing manner to effectively control the strain of the semiconductor epitaxy structure to avoid the crack of the epitaxy layer. The detail method for controlling the strain of the semiconductor epitaxy structure is described as follows. The curvature monitor system 12 is utilized to monitor the curvature value of the semiconductor epitaxy structure. The control unit 13 is electrically connected to the deposition apparatus 11 and the curvature monitor system 12. The control unit 13 dominates the deposition apparatus 11 to stop depositing the buffer layer 21, the first epitaxy layer 22, the insertion layer 23 and the second epitaxy layer 24 on the substrate 20 based on the curvature value measured by the curvature monitor system 12. That is, the control unit 13 can control the deposition time and deposition thickness of the above mentioned deposition layer. It is important to emphasize that the system for manufacturing the semiconductor epitaxy structure does not control the deposition time according to the recipe which the thickness of each deposition layer is defined, but determines whether stop depositing or not based on the curvature value of the semiconductor epitaxy structure.

Figure 2:
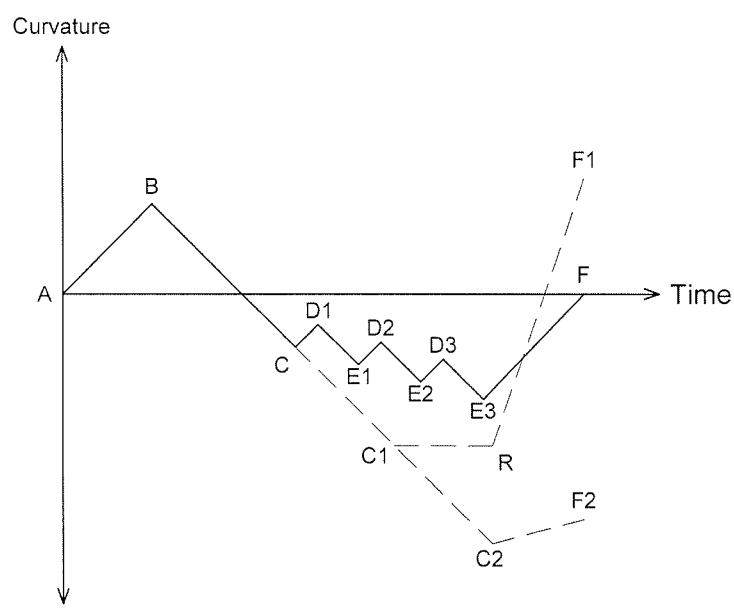
FIG. 2 is a diagram schematically illustrating variation of curvature value of a semiconductor epitaxy structure in a manufacturing process.

Referring to FIG. 2, and FIG. 3, FIG. 2 and FIG. 3 illustrates a method for manufacturing the semiconductor epitaxy structure according to an embodiment of the present invention. Below to deposit GaN on silicon (Si) substrate as an example for illustration. Firstly, a substrate 20 is provided, and the substrate 20 is monitored by a curvature monitor system to get a curvature value. Secondly, a buffer layer 21 is deposited on the substrate 20 to prevent the melt back etching during growth. In one embodiment, the buffer layer 21 may be aluminum nitride (AlN). Due to the lattice constant of the aluminum nitride (AlN) is 0.311 nm and the lattice constant of the silicon is 0.54 nm, so that thermal expansion coefficient of AlN and silicon is different and the semiconductor epitaxy structure has a first strain which make the semiconductor epitaxy structure shows a curvature state toward a first direction. In the embodiment, the semiconductor epitaxy structure shows a tensile tendency. With the increased deposition time, the curvature of the semiconductor epitaxy structure is changed from point A to point B. In the meantime, the curvature monitor system can be utilized to monitor the curvature value of the semiconductor epitaxy structure in real time to determine whether stop depositing the buffer layer 21 or not.

Continuing the above description, a first epitaxy layer 22 is deposited on the buffer layer 21. In one embodiment, the first epitaxy layer may be GaN. Because of the lattice constant of the GaN is 0.318 nm and the lattice constant of the AlN is 0.311 nm, so that thermal expansion coefficient of GaN and MN is different and the semiconductor structure has a second strain which drives the semiconductor epitaxy structure curve toward a second direction opposite to the first direction. With the increased deposition time of the first epitaxy layer 22, the second strain is gradually increased to make the semiconductor epitaxy structure curve toward the second direction. In this embodiment, the semiconductor epitaxy structure shows a compressive tendency. With the increased deposition time, the curvature of the semiconductor epitaxy structure is changed from point B to point C. In the meanwhile, the curvature monitor system can be utilized to monitor the curvature value of the semiconductor epitaxy structure in real time to determine whether stop depositing the first epitaxy layer 22 or not.

It can be understood that the thickness of the first epitaxy layer 22 can be increased by continuously depositing the first epitaxy layer 22 so that the compressive stress will be accumulated, as shown in FIG. 2 at point C1. The accumulated compressive stress will drive lattice relaxation (as shown point R in FIG. 2) which results semiconductor epitaxy structure shows the tensile tendency after cooling down, as shown point F1 in FIG. 2. In other case, excessive compressive stress (as shown point C2 in FIG. 2) with plastic deformation cannot be dissipated during the cooling down process so that the semiconductor epitaxy structure shows the compressive tendency after cooling down, as shown point F2 in FIG. 2. Hence, while the curvature value of the semiconductor epitaxy structure monitored by the curvature monitor system has reached to a predefined curvature value, the deposition apparatus should stop depositing the first epitaxy layer 22.

Continuing the above description, an insertion layer 23 is deposited on the first epitaxy layer 22. In one embodiment, the buffer layer 21 and the insertion layer 23 may be the same or different materials. For example, the insertion layer may be AlN or aluminum gallium nitride (AlGaN). In this embodiment, the insertion layer may be AlN. As above description, the lattice constant and thermal expansion coefficient of the AlN and GaN are different, hence there is a third strain formed. However, it is different from the aforementioned that MN (insertion layer 23) is deposited above the GaN (first epitaxy layer 22) so that the semiconductor epitaxy structure driven by the third strain curves toward the first direction. Because the resultant of the first strain and the third strain is smaller than the second strain, the third strain is not sufficient to render the semiconductor epitaxy structure show a tensile tendency, but only reduce the extent of the semiconductor epitaxy structure curving downward. With the increased deposition time, the curvature of the semiconductor epitaxy structure is changed from point C to point D1. In the meanwhile, the curvature monitor system is utilized to monitor the curvature value of the semiconductor epitaxy structure in real time to determine whether stop depositing the insertion layer 23 or not.

Finally, a second epitaxy layer 24 is deposited on the insertion layer 23. In one embodiment, the second epitaxy layer 24 and the first epitaxy layer 22 may be the same or different materials. In this embodiment, the second epitaxy layer may be GaN. There is a fourth strain formed based on the difference of thermal expansion coefficient and lattice constant between the second epitaxy layer 24 (GaN) and the insertion layer 23 (AlN). GaN is deposited above the AlN so that the semiconductor epitaxy structure driven by the fourth strain curves toward the second direction. Because the semiconductor epitaxy structure should be curved to reach a proper curvature before cooling, the fourth strain should be greater than the third strain to increase the curvature of the semiconductor epitaxy structure. With the increased deposition time, the curvature of the semiconductor epitaxy structure can be changed from point D1 to point E1. It can be understood that the accumulated compressive stress in the semiconductor epitaxy structure can drive the lattice relaxation during depositing or cannot be dissipated during cooling down. Similarly, the curvature monitor system can be utilized to monitor the curvature value of the semiconductor epitaxy structure in real time to determine whether stop depositing the second epitaxy layer 24 or not.

It can be understood that, if the required thickness of the GaN epitaxy layer is achieved by depositing single second epitaxy layer 24 and the curvature of the semiconductor epitaxy structure is in a proper range, the semiconductor epitaxy structure can be cooled down to finish the manufacturing process. Generally, it is difficult to obtain a thicker and crack-free GaN epitaxy layer by depositing single second epitaxy layer 24. Therefore, the insertion layer 23 and the second epitaxy layer 24 can be repeatedly deposited in an interlacing manner to obtain the required thickness of the GaN epitaxy layer, and then cooling down the semiconductor epitaxy structure to finish the manufacturing process. In the semiconductor epitaxy structure shown in FIG. 3, for example, with depositing the insertion layer 23 and the second epitaxy layer 24 in the interlacing manner, the curvature of the semiconductor epitaxy structure is changed from point E1 to point D2, from point D2 to point E2, from point E2 to point D3, and then from point D3 to point E3. Finally, the curvature of the semiconductor epitaxy structure is changed from point E3 to point F after cooling down process. As foregoing description, the system for manufacturing the semiconductor epitaxy structure of the present invention does not control the deposition time according to the recipe which the thickness of each deposition layer is defined, but determines whether stop depositing or not based on the curvature value of the semiconductor epitaxy structure. Therefore, the thickness of each insertion layer 23 may be different. Similarly, the thickness of each second epitaxy layer 24 may also be different. As shown in FIG. 2, in the manufacturing process, an operator may deposit one insertion layer 23 to reduce the curvature of the semiconductor epitaxy structure at the appropriate time based on the curvature value of the semiconductor epitaxy structure measured by the curvature monitor system in real time, so that the accumulated compressive stress in the semiconductor epitaxy structure will not drive the lattice relaxation during depositing or can be dissipated during cooling down.

Figure 4:
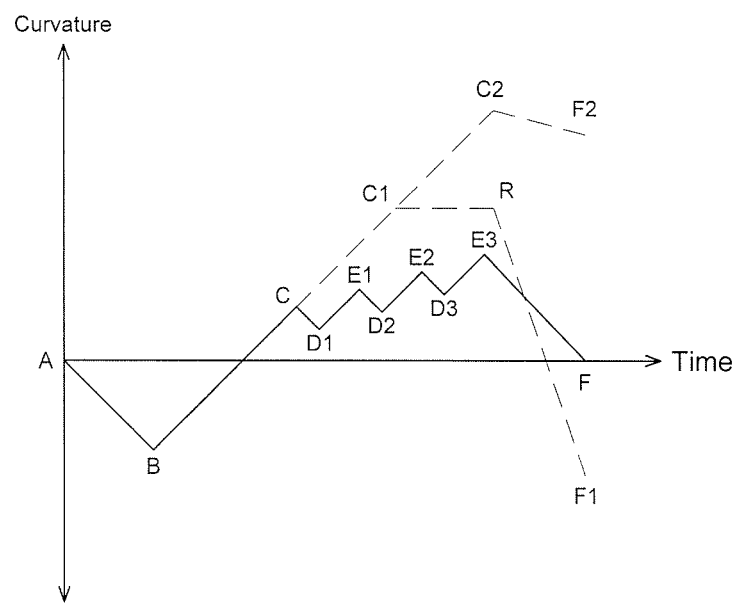
FIG. 4 is a diagram schematically illustrating variation of curvature value of another semiconductor epitaxy structure in a manufacturing process.

It should be noted that variation of curvature value of the semiconductor epitaxy structure shown in FIG. 2 is an example for illustration based on depositing GaN on the Si substrate. However, the semiconductor epitaxy structure may have different curvature performance by choosing different deposition materials and the substrate. For example, the tensile stress is generated by depositing GaN epitaxy layer on a sapphire substrate. In other words, the compressive stress will be generated during the cooling down process. Therefore, before cooling down, the substrate should be maintained in a tensile tendency. According to the semiconductor epitaxy structure shown in FIG. 3, the variation of curvature value of the semiconductor epitaxy structure is shown in FIG. 4 by sequentially depositing indium nitride (InN) as the buffer layer 21, GaN as the first epitaxy layer 22, at least one of InN and indium gallium nitride (InGaN) as the insertion layer 23 and GaN as the second epitaxy layer 24. It can be understood that the deposition time or thickness of each deposition layer is determined by the curvature value of the semiconductor epitaxy structure measured by the curvature monitor system in real time.

To summarize the foregoing descriptions, the method and the system for manufacturing the semiconductor epitaxy structure of the present invention can determine the deposition time and thickness of the buffer layer, the epitaxy layer and the insertion layer based on the curvature value of the semiconductor epitaxy structure measured by the curvature monitor system in real time, so that the strain of the semiconductor epitaxy structure can be effectively controlled, and then the lattice relaxation caused by the accumulated stress can be prevented or the accumulated stress can be dissipated during cooling down.

While the invention is susceptible to various modifications and alternative forms, a specific example thereof has been shown in the drawings and is herein described in detail. It should be understood, however, that the invention is not to be limited to the particular form disclosed, but to the contrary, the invention is to cover all modifications, equivalents, and alternatives falling within the scope of the appended claims.

What is claimed is:

1. A method for manufacturing semiconductor epitaxy structure comprising:
    providing a substrate which is monitored in real time by a curvature monitor system to get a curvature value;
    depositing a buffer layer on the substrate, wherein thermal expansion coefficient and lattice constant of the buffer layer and the substrate are different so that the semiconductor epitaxy structure has a first strain to curve toward a first direction and the curvature monitor system monitors the curvature value of the semiconductor epitaxy structure in real time to determine whether stop depositing the buffer layer or not;
    depositing a first epitaxy layer on the buffer layer, wherein thermal expansion coefficient and lattice constant of the first epitaxy layer and the buffer layer are different so that the semiconductor epitaxy structure has a second strain to curve toward a second direction and the curvature monitor system monitors the curvature value of the semiconductor epitaxy structure in real time to determine whether stop depositing the first epitaxy layer or not;
    depositing an insertion layer on the first epitaxy layer, wherein thermal expansion coefficient and lattice constant of the insertion layer and the first epitaxy layer are different so that the semiconductor epitaxy structure has a third strain to curve toward the first direction and the curvature monitor system monitors the curvature value of the semiconductor epitaxy structure in real time to determine whether stop depositing the insertion layer or not; and
    depositing a second epitaxy layer on the insertion layer, wherein thermal expansion coefficient and lattice constant of the second epitaxy layer and the insertion layer are different so that the semiconductor epitaxy structure has a fourth strain to curve toward the second direction and the curvature monitor system monitors the curvature value of the semiconductor epitaxy structure in real time to determine whether stop depositing the second epitaxy layer or not.

2. The method for manufacturing semiconductor epitaxy structure according to claim 1, wherein the insertion layer and the second epitaxy layer are repeatedly deposited in an interlacing manner, and the curvature monitor system monitors the semiconductor epitaxy structure in real time to check if the curvature value of the semiconductor epitaxy structure has reached a predefined curvature value to determine whether stop depositing the insertion layer and the second epitaxy layer or not.

3. The method for manufacturing semiconductor epitaxy structure according to claim 1, wherein the resultant of the first strain and the third strain is smaller than the second strain.

4. The method for manufacturing semiconductor epitaxy structure according to claim 1, wherein the fourth strain is greater than the third strain.

5. The method for manufacturing semiconductor epitaxy structure according to claim 1, wherein the first epitaxy layer and the second epitaxy layer are the same material.

6. The method for manufacturing semiconductor epitaxy structure according to claim 1, wherein the buffer layer and the insertion layer are the same material.

7. The method for manufacturing semiconductor epitaxy structure according to claim 1, wherein the substrate is a silicon substrate or a sapphire substrate.

8. The method for manufacturing semiconductor epitaxy structure according to claim 1, wherein the buffer layer comprises at least one of aluminum nitride and indium nitride.

9. The method for manufacturing semiconductor epitaxy structure according to claim 1, wherein the insertion layer comprises at least one of aluminum nitride, aluminum gallium nitride, indium nitride and indium gallium nitride.

10. The method for manufacturing semiconductor epitaxy structure according to claim 1, wherein the first epitaxy layer and the second epitaxy layer comprise gallium nitride.

* * * * *